United States Patent [19]
White

[11] Patent Number: 5,270,953
[45] Date of Patent: Dec. 14, 1993

[54] FAST CONVOLUTION MULTIPLIER

[75] Inventor: Stanley A. White, San Clemente, Calif.

[73] Assignee: Rockwell International Corporation, Seal Beach, Calif.

[21] Appl. No.: 938,080

[22] Filed: Aug. 31, 1992

Related U.S. Application Data

[63] Continuation-in-part of Ser. No. 705,042, May 23, 1991, abandoned.

[51] Int. Cl.$^5$ ............................................. G06F 15/31
[52] U.S. Cl. ............................................. 364/724.18
[58] Field of Search ...................... 364/724.18, 724.12, 364/724.13

[56] References Cited

U.S. PATENT DOCUMENTS

| | | | |
|---|---|---|---|
| 4,118,784 | 10/1978 | Nussbaumer | 364/724.18 |
| 4,807,173 | 2/1989 | Sommen et al. | 364/724.18 |
| 4,941,185 | 7/1990 | Reed | 364/724.18 |
| 4,992,967 | 2/1991 | Auvray | 364/724.18 |

Primary Examiner—David H. Malzahn
Attorney, Agent, or Firm—H. Fredrick Hamann; George A. Montanye; Tom Streeter

[57] ABSTRACT

The present invention provides a method and apparatus for performing finite impulse response (FIR) type filtering of 2N points of real-only input data using fewer multiplication elements than traditionally required. A filter multiplexer segregates or divides the input data into even and odd data values which are transferred to the "real" and "imaginary" inputs of a fast Fourier Transformation (FFT) or DFT element which selectively performs N-point transformations according to a preselected FFT algorithm. The transformed data output by the FFT transformer is divided into even and odd transformed, frequency domain, data. The even and odd transformed data is transferred to a multiplier where it is multiplied by a preselected weighting matrix of coefficients and the DFT of the desired filter response. The resulting data is divided into even and odd transformed data functions which are recombined to provide the transform of the multiplier input data function. Data thus transformed is transferred to an IFFT transformer where it is transformed to the time domain and subsequently de-multiplexed into a filtered data output. The frequency domain multiplication is obtained using N/2 multiplier section each employing twelve multipliers. The resulting filter or fast convolution apparatus is optimized in terms of multiplications per point making it more efficient than previous filter devices.

19 Claims, 10 Drawing Sheets

FAST CONVOLUTION MULTIPLIER

This is a continuation-in-part application of copending application Ser. No. 07/705,042 filed on May 23, 1991, now abandoned.

BACKGROUND OF THE INVENTION

1. Field of the Invention

The present invention relates to signal processing and more particularly to mechanizing finite ($\leq$N TAP) impulse response filters using N-point fast-Fourier transformations and fast convolution. The invention further relates to a multiplier structure for use in a real-only data fast convolution filter with a minimum number of multiplication elements.

2. Related Technical Art

Finite impulse response filters are used extensively in many advanced signal-processing applications for signal equalization, adaptive filtering, contouring, and improving signal-to-noise ratios. Modern digital signal processing has advanced the applicability of FIR filters through the use of fast convolution and fast-Fourier transformation techniques, each of which reduce overall filter size and provide high speed high transfer rate digital implementations.

However, aside from speed and data-throughput requirements, system complexity and size are still major concerns for many filter implementations. Larger or more complex filters are often harder to manufacture and consume too much power for many applications. Increased system complexity also requires increased numbers of computational elements to mechanize a given function, both in terms of hardware and software. Therefore, highly complex or computational intensive algorithms and processing designs demand more circuitry or computational elements and, often, larger circuit memory to implement, either of which is undesirable in many applications. Unfortunately, the filter accuracy demanded in many advanced technology applications also requires very long or more complex filter structures.

The typical approach to fast convolution FIR filter mechanization relies on certain conventional or traditional methods of complex frequency data multiplication in the transition between fast-Fourier transform (FFT) data and inverse-fast-Fourier transform (IFFT) data, or between frequency and time domain data during the filtering process. The number of real multiplications per input data point dictated by these techniques is relatively high and translates to an excessive number of multiplication elements in the filter apparatus. The number of multiplications or multipliers needed for FIR filtering with 128 (or more) coefficients, even with known circuit reduction techniques can consume a large amount of apparatus area or software memory to accommodate.

What is needed, then, is a method of maximizing computational performance and providing the equivalent of very long FIR filter structures, while minimizing the amount of circuitry required to perform frequency domain multiplications. It is also desirable to implement the filter processing functions in a compact architecture which utilizes well understood manufacturing technology and is inexpensive to implement. A flexible structure capable of dynamically changing multiplicative factors based on specific application requirements would also be useful.

SUMMARY

In view of the above problems associated with the art and desired new features, it is one purpose of the present invention to provide a digital FIR filter capable of accommodating N coefficients in transformation calculations with decreased multiplicative complexity.

An advantage of the invention is the ability to perform high speed transformations on large amounts of real-only data with a reduced number of multiplication processing elements.

Another advantage of the invention is that the resulting filter or fast convolution apparatus is optimized or improved in terms of multiplications per point and is more efficient than previous devices.

These and other purposes, objects, and advantages are realized in an apparatus and method for performing preselected finite impulse response (FIR) type signal filtering employing N-point fast convolution and fast Fourier transformations on 2N points of real-only input data. A new multiplication configuration is used to accomplish frequency domain multiplication in the transition between frequency and time domain filter stages (between FFT and IFFT) which reduces the number of multiplications required and, therefore, decreases the filter size.

The fast convolution filter is connected to a plurality of signal-input lines, typically 128 (2N), and a corresponding number of signal-output lines. The filter can use an input memory to receive and store data from the input lines as desired. A first multiplexer segregates or divides the input data into even and odd sample numbers which are transferred to the "real" and "imaginary" inputs of a fast Fourier Transformation (FFT) or DFT element which selectively performs N-point transformations according to a preselected FFT algorithm. The transformed data output by the FFT transformer is divided into even and odd transformed, frequency domain, data. The even and odd transformed data is transferred to a multiplier where it is multiplied by a preselected weighting vector of coefficients. This vector is the Fourier transform of the zero padded desired filter impulse response. The resulting weighted data is again divided into even and odd response-weighted transformed data and recombined to provide the Fourier transform of the desired output data. Data thus transformed is transferred to an IFFT where it is transformed to the time domain and subsequently de-multiplexed into a filtered data output.

In further aspects of the invention, Fourier transformed input data is divided into N/2 pairs of complex data each of which are transferred to one of N/2 multiplier sections for processing. Each $k^{th}$ multiplier section receives the $k^{th}$ and $(N-k-1)^{st}$ data from the Fourier transformer. Within each multiplier section the input data is further divided into even and odd data by a set of summation elements and dividers. The imaginary portion of the Fourier transformer data for the $k^{th}$ and $(N-k-1)^{th}$ data points, where $0 \leq k \leq N-1$, are added together in one summation element or adder and divided by two to generate the real portion of desired odd transformer data. The imaginary portion of the FFT output for the $(N-k-1)^{th}$ data point is also subtracted from the imaginary FFT output for the $k^{th}$ data point in a second summation element and divided by two to provide the imaginary portion of desired even data. The real portion of the FFT output for the $k^{th}$ and the $(N-k-1)^{th}$ data points are summed in a third adder and divided by two to provide the real portion of desired even Fourier transformer data. The real portion of the FFT output for the $k^{th}$ data point is also subtracted from the real FFT output for the $N-1-k^{th}$ data point in a fourth summation element and divided by two to provide the imaginary portion of the desired odd data.

The real and imaginary portions of the odd data are summed in a fifth adder and then multiplied by a weighting factor $(\cos\pi k/N - \sin\pi k/N)$ in a first multiplier. The real and imaginary portions of the odd data are also multiplied times the factors $\sin\pi k/N$ and $\cos\pi k/N$, respectively, in second and third multipliers and summed in a sixth adder. The imaginary portion of the transformed even data is both summed with the sixth adder addend, in an eighth adder, to provide the imaginary portion of a $k^{th}$ intermediate transformed data, and has the addend subtracted, in a ninth adder, to provide the imaginary portion of the $(N+k)^{th}$ intermediate transformed data.

At the same time, the real portion of the weighted and combined odd data from the first and second multipliers are summed and the weighted imaginary portion of the transformed odd data subtracted therefrom in a seventh adder. The real portion of the transformed even data is both summed with the addend from the seventh adder, in a tenth adder, to provide the real portion of the $k^{th}$ intermediate data function, and has the addend subtracted, in an eleventh adder, to provide the real portion of the $(N+k)^{th}$ intermediate data.

The imaginary and real portions of the $k^{th}$ intermediate data are weighted by the real and imaginary portions, respectively, of the Fourier transform of the complex filter response for the $k^{th}$ data point by multiplication in fourth and fifth multipliers. Both the real and imaginary portions of the $k^{th}$ intermediate data are also added together, in a twelfth adder, and multiplied by the difference between the real and imaginary portions of the transformed complex filter response for the $k^{th}$ data point in a sixth multiplier. This latter product is added, in a fourteenth adder, to the real portion of the response weighted $k^{th}$ intermediate data, from the fifth multiplier, and has the imaginary weighted $k^{th}$ intermediate data, from the fourth multiplier, subtracted to provide the real portion of the $k^{th}$ transformed intermediate data. The response weighted imaginary and real $k^{th}$ intermediate data are added together, in a fifteenth adder, to provide the imaginary portion of the $k^{th}$ transformed intermediate data.

At the same time, the imaginary and real portions of the $(N+k)^{th}$ intermediate data are multiplied, in seventh and eight multipliers, by the real and imaginary portions, respectively, of the Fourier transformed complex filter response for the $(N-k-1)^{th}$ point. Both the real and imaginary portions of the $(N+k)^{th}$ intermediate data are summed, in a thirteenth adder, and weighted by the total transformed filter response for the $(N-k)^{th}$ point, using a ninth multiplier. This latter product is summed with the response weighted real $(N+k)^{th}$ data, in a sixteenth adder, and has the imaginary portion of the weighted $N+k^{th}$ data subtracted to provide the real portion of the $(N+k)^{th}$ transformed intermediate data. The weighted imaginary and real $(N+k)^{th}$ data are summed, in a seventeenth adder, to provide the imaginary portion of the $(N+k)^{th}$ transformed intermediate data.

The real portion of the $k^{th}$ transformed intermediate data is added to the real portion of the $(N+k)^{th}$ transformed intermediate data, in an eighteenth adder or summation element, and has the real portion of the $(N+k)^{th}$ transformed intermediate data subtracted from it in a nineteenth summation element. At the same time, the imaginary portion of the $k^{th}$ transformed intermediate data has the imaginary portion of the $(N+k)^{th}$ transformed intermediate data subtracted from it, in a twentieth summation element and is summed with the imaginary portion of the transformed $(N+k)^{th}$ transformed intermediate data, in a twenty-first summation element.

The outputs of the eighteenth and twenty-first summation elements are each divided by two to produce the real and imaginary portions, respectively, of the $k^{th}$ even transformed and multiplied data point. The outputs of the nineteenth and twentieth summation elements are summed, in a twenty-second adder, and multiplied by the weighting factor $(\cos\pi k/N + \sin\pi k/N)$ in a tenth multiplier. The outputs from the nineteenth and twentieth summation elements are also individually multiplied, in eleventh and twelfth multipliers, by the weighting factors $(\cos\pi k/N)$ and $(\sin\pi k/N)$, respectively. The weighted products from the eleventh and twelfth multipliers are summed, in a twenty-third summation element, and divided by two to provide the imaginary portion of the $k^{th}$ odd transformed and multiplied data point. The weighted products from the tenth and twelfth multipliers are subtracted from the product of the eleventh multiplier, in a twenty-fourth summation element, and divided by two to provide the real portion of the $k^{th}$ odd transformed and frequency multiplied data point.

Four final summation elements in each multiplier section combine the odd and even $k^{th}$ point data together to provide the final frequency multiplier transformed data output for the $k^{th}$ and $(N-k-1)^{th}$ data points input to each multiplier section. This is accomplished by adding the real portion of the even and imaginary portion of the odd transformed data to produce the real portion of the transformed $(N-k-1)^{th}$ data point, and adding the imaginary portions of the even and real portion of the odd transformed $k^{th}$ data to produce the imaginary portion of the transformed $k^{th}$ data point. The imaginary portion of the odd transformed data is subtracted from the real portion of the even transformed data to produce the real portion of the transformed $k^{th}$ data while the imaginary portion of the even transformed $k^{th}$ data is subtracted from the real portion of the odd transformed $k^{th}$ data to produce the imaginary portion of the transformed $(N-k-1)^{th}$ data point. The resulting real and imaginary portions of the transformed $k^{th}$ and $(N-k-1)^{th}$ data points, representing the transformed FFT output function, are transferred to an inverse fast Fourier transformation element where they are transformed to the time domain and subsequently de-multiplexed for the remainder of the filter processing.

In a preferred embodiment, the apparatus further comprises an input formatting register connected in series with the signal-input lines for the fast convolution filter and converts input data received in either serial or parallel format into a desired parallel format for processing. An output formatting register is also connected in series with the filter signal-output lines and converts output data from parallel format to either desired serial or parallel formats.

The resulting filter structure requires fewer multiplication operations and, thus, fewer multiplier elements for implementation which decreases the apparatus complexity and size. The resulting filter or fast convolution apparatus is optimized in terms of multiplications per point making it more efficient than previous filter devices. The multiplication apparatus can be used in many applications, including an array of such computational devices to handle large amounts of data.

BRIEF DESCRIPTION OF THE DRAWINGS

The novel features of the present invention may be better understood from the accompanying description when taken in conjunction with the accompanying drawings in which like numbers refer to like elements, and in which.

DETAILED DESCRIPTION OF PREFERRED EMBODIMENTS

The present invention provides a method and apparatus for performing finite impulse response (FIR) type filtering of 2N points of real-only input data using fewer multiplication elements, about half, than traditionally required. A new multiplication scheme is used to accomplish frequency domain multiplication in the transition between frequency and time domain filter stages (between FFT and IFFT) which reduces the number of multiplications required. The reduced number of multiplication operations requires fewer multiplier elements for implementation which decreases the apparatus complexity and size. The resulting filter or fast convolution apparatus is optimized in terms of multiplications per point making it more efficient than previous filter devices. The multiplication apparatus can be used in many applications, including an array of such computational devices to handle large amounts of data.

As discussed above, a major problem with mechanizing signal processing filters is the number of multiplications required when transforming between the frequency and time domains or between fast-Fourier transformations (FFT) and inverse fast-Fourier transformations (IFFT) during the filtering process. Direct, full array, mechanization of an N-tap FIR filter, where N is the total number of data points processed, requires N real multiplies and N−1 additions per output sample. A conventional fast convolution mechanization, multiplexed array, reduces this requirement but still requires about $2(1+\log_2 N)$ complex multiplications per valid output sample. Since four real multiplies are typically required to implement each complex multiplication, as real-only products, a total of $8(1+\log_2 N)$ real multiplies are required for each valid output sample.

Figure 1:
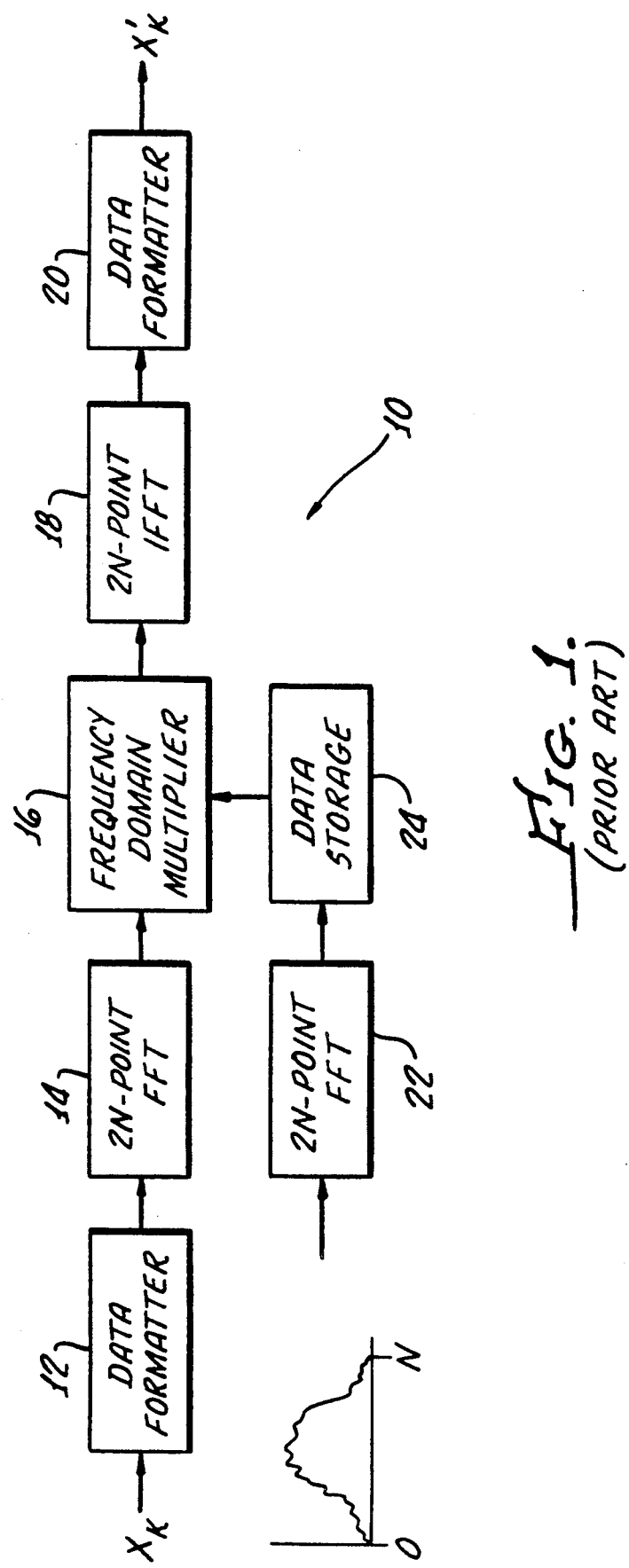
FIG. 1 illustrates an overview of a conventional tapped filter processor utilizing both 2N-point FFT and IFFT structures with a complex multiplication interface stage.

A conventional fast convolution filter structure is illustrated in FIG. 1, and shows the application of 2N-point FFT's and IFFT's to process the data. In FIG. 1, a fast convolution filter 10 receives data collected for a given filtering application along an input data bus from one of many known sources, such as sensors, preprocessors, A/D converters, or data memory. The data may be received in one of many known data formats and may be presented as a serial data stream or along a parallel input bus. Therefore, a data formatting element 12 is typically used to preformat or reformat the incoming data, as necessary, to interface with the input of a 2N-point FFT element 14. Where desired, an input register, not shown, can also be used for accumulating the data at one transfer rate and transferring the data for processing at a different rate and a buffer or other latch and transfer circuit could be used as known in the art. Those skilled in the art will recognize that a variety of elements can be used and a specific structure is not necessary for the operation of the invention itself.

The 2N-point FFT element 14 performs complex FFT operations on the input data points transforming them to the frequency domain and transfers the transformed output to a series of frequency domain multipliers 16. The frequency multipliers 16 apply various signal weighting factors to the frequency data which is then processed in an Inverse FFT (IFFT) element or stage 18 is for transformation to the time domain. The time domain data may then be reformatted in a data formatter 20, to interface with a variety of known apparatus and data bus requirements, either in parallel or serial, as desired for a specific application.

To apply fast convolution to the filter 10, a 2N-point FFT element 22 is used to compute the N-tap filter response for its N data points padded with an additional N zeros. The output of the transformer 22 is the DFT of the filter impulse response or the frequency domain impulse response $G_k$ of the filter which provides complex factors used in the multipliers 16, where $G_k$ is of the form $C_k + jD_k$ ($k = 0, 1, \ldots, 127$). The filter 10 response is preselected or computed in advance of use in the multipliers 16 and can be adjusted or shaped during the DFT process as desired. Those skilled in the art are familiar with desirable filter responses and how to adjust the operation of an FFT element to alter characteristics of the generated impulse response $G_k$. The impulse response values are stored in a storage or memory element 24 for recall during processing. The memory element 24 can comprise a series of memory registers, RAM circuits, or other storage elements familiar to those skilled in the art and only requires optimization in appropriate materials such as GaAs or CMOS.

In addition, using conventional fast convolution, the input data is typically transferred as 2N points of data for the FFT element 14. Various techniques are used to overlap and save or overlap and add the processed data to obtain the desired filtering of 2N points of data. These and other fast convolution techniques or methods are discussed in more detail in textual materials such as L. R. Rabiner and B. Gold, *Theory and Application of Digital Signal Processing*, Prentice Hall, 1975, pages 63–67; A. V. Oppenheim and R. W. Schafer, *Discrete-Time Signal Processing*, Prentice Hall, 1989, pages 558–560, 722; and A. Peled and B. Liu, *Digital Signal*

*Processing Theory, Design, and Implementation*, J. Wiley & Sons, 1976, pages 160-161, which are incorporated herein by reference.

To understand the complexity of the basic filter of FIG. 1, assume that N equals 64 or that the FFT element 14 is a 128-point (2N) FFT processor transformation element. A 128-point transformer can be structured using a decomposition rule that allows the decomposition of complex transformations into smaller point size transformations which are then distributed as smaller computational blocks. An N-point FFT can be decomposed into a set of smaller point size FFTs, X and Y, when N is factorable into non-negative integers, which results in one transformation level or tier of X Y-point FFTs and one tier of Y X-point FFTs.

The 128-point transformer 12 can be decomposed into 2 64-point transformers and 64 2-point transformers. The 64 point transformers can also be decomposed into 48 4-point transformers (4 16-point+16 4-point=32+16 4-point). Where there are $x_n$ input time samples of data resulting in $X_k$ output frequency samples from a FFT and the coefficients or "twiddle factors" employed for decimation are stated as $W_N^{nk} = e^{-\pi j nk/N}$ each FFT is expressed by the relationship:

$$X_k = \sum_{n=0}^{N-1} x_n W_N^{nk} \tag{1}$$

where N is the number of both the input and output samples. For 2-point transformations the above equation becomes:

$$X_k = \sum_{n=0}^{1} W_2^{nk} x_n = \sum_{n=0}^{1} (-1)^{nk} x_n = x_0 + (-1)^k x_1 \tag{2}$$

$$[W_2 = e^{-j2\pi/2} = -1]$$

with $$X_0 = (x_{0R} + x_{1R}) + j(x_{0I} + x_{1I}),$$

and $$X_1 = (x_{0R} - x_{1R}) + j(x_{0I} - x_{1I})$$

where the subscripts R and I denote the real and imaginary portions, respectively. The 4-point transformations become:

$$X_k = \sum_{n=0}^{3} W_4^{nk} x_n = \sum_{n=0}^{3} (-j)^{nk} x_n \tag{3}$$

$$[W_4 = e^{-j2\pi/4} = -j]$$

with:

$$X_0 = x_0 + x_1 + x_2 + x_3 = (x_0 + x_2 + (x_1 + x_3) = [(x_{0R} + x_{2R}) + (x_{1R} + x_{3R}) + j(x_{0I} + x_{2I}) + (x_{1I} + x_{3I})],$$

$$X_1 = [(x_{0R} - x_{2R}) + (x_{1I} - x_{3I})] + j[(x_{0I} - x_{2I}) - (x_{1R} - x_{3R})],$$

$$X_2 = [(x_{0R} + x_{2R}) - (x_{1R} + x_{3R})] + j[(x_{0I} + x_{2I}) - (x_{1I} + x_{3I})],$$

and $$X_3 = [(x_{0R} - x_{2R}) - (x_{1I} - x_{3I})] + j[(x_{0I} - x_{2I}) + (x_{1R} - x_{3R})]$$

Figure 2A:
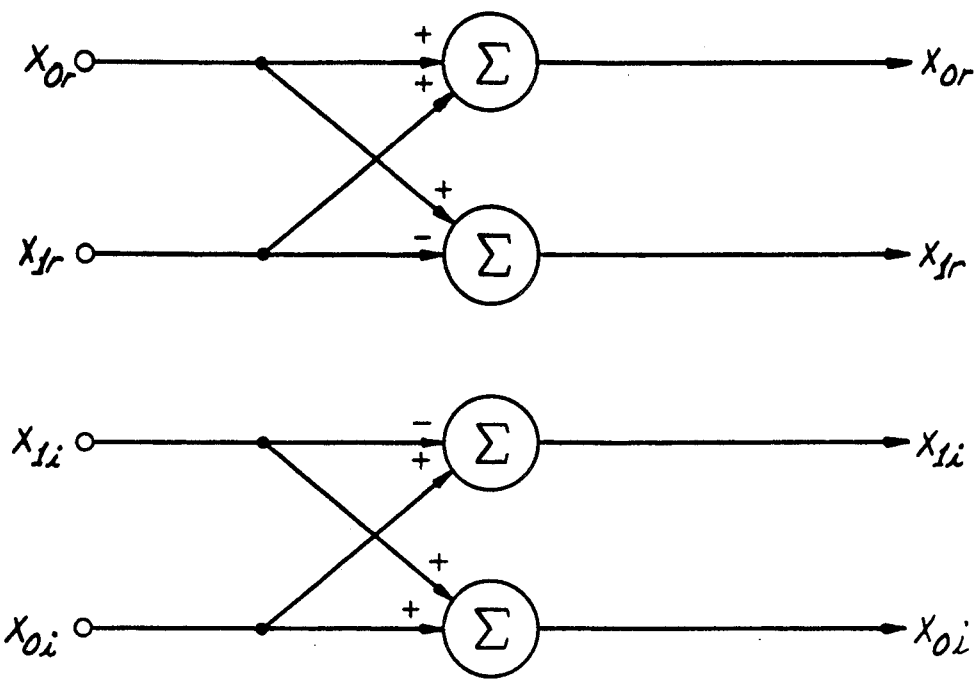
FIGS. 2a and 2b illustrate the functional operation of multiplier free 2-point and 4-point DFTs useful in the apparatus of FIG. 1.
Figure 2B:
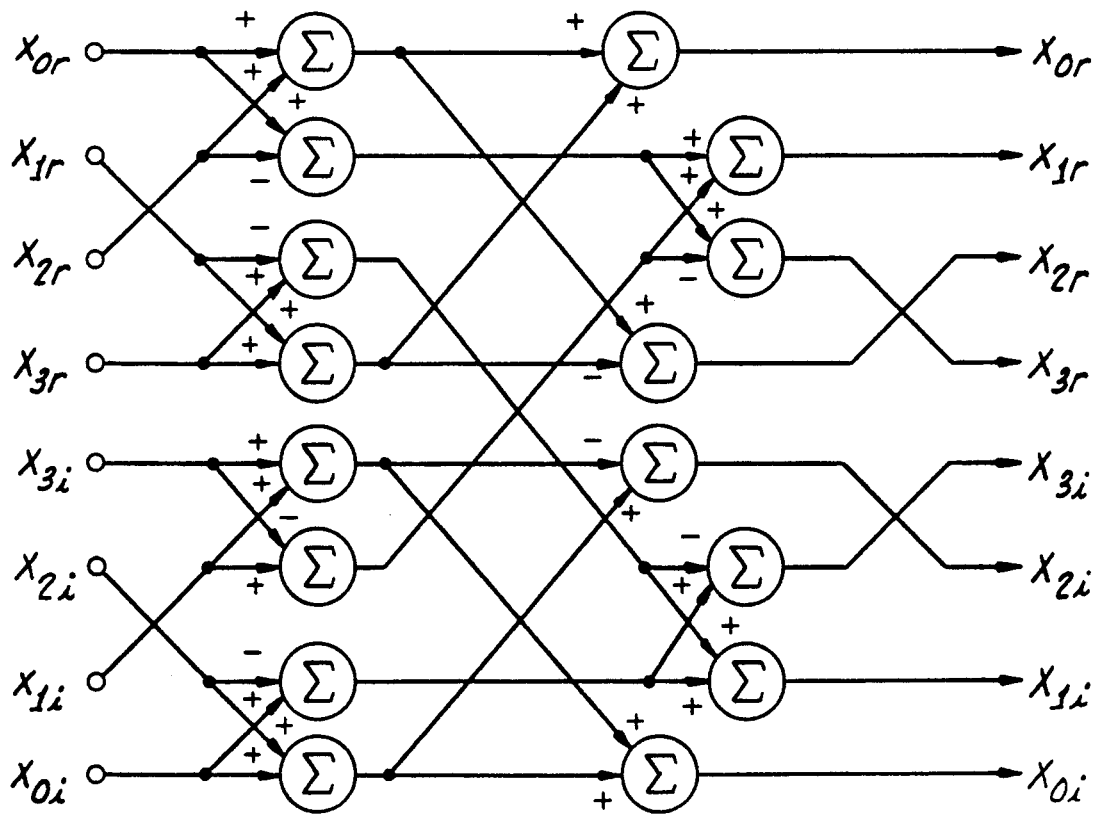

Well known exemplary apparatus for implementing 2-point and 4-points DFTs using summation elements or adders are illustrated in FIGS. 2a and 2b, respectively. In these implementations, the 2-point and 4-point transformers are multiplier free structures. (Less well known are the 3-point and 6-point multiplier-free transformers.) However, to interface with other transformation elements each P-point DFT requires P-1 interstage coupling complex multipliers. The transformers in the first row and first column require no external multipliers.

Since each complex multiplication requires four real multiplications to implement, $(16-1)(3-1)=30$ forty-eight 4-point transformers require $4\times(4-1)\times 30 = 360$ real multiplications. Therefore, to achieve a 128-point transformation, for 2N equal to 128, with two 64-point transformations per forward FFT transformation requires 1035 real multiplications. Each of 2 64 point transformers requires its own 360 internal multiplies. Furthermore, one 64-point transformer requires $(64-1)\times 4$ real multiplies for output couplers. In addition, 63 2-point transformers each require 1 complex multiply. The filter 10 requires the same number of multiplications, 1035, for the inverse IFFT process, and 4 multiplications for each of the 128 input points (or 512 multiplications) to transform the frequency domain data between the FFT and IFFT stages. Therefore, the total number of real multiplications is about 2582 or about 40 per valid output point. The economy improves with increasing N.

To reduce multiplication requirements, complex multiplications in both the FFT and IFFT elements 12 and 16, and in the frequency domain multipliers 16 can be reduced to fewer real multiplications by application of the well known Speiser identity:

$$(A+jB)(C+jD) = [(A+B)(C-D) + AD - BC] + j[AD + BC] \tag{4}$$

This reduces the total number of real multiplies by 25%. A signal processing structure of complex multiplier used to implement the Speiser identity of equation 1 is illustrated in schematic form in FIG. 3.

Figure 3:
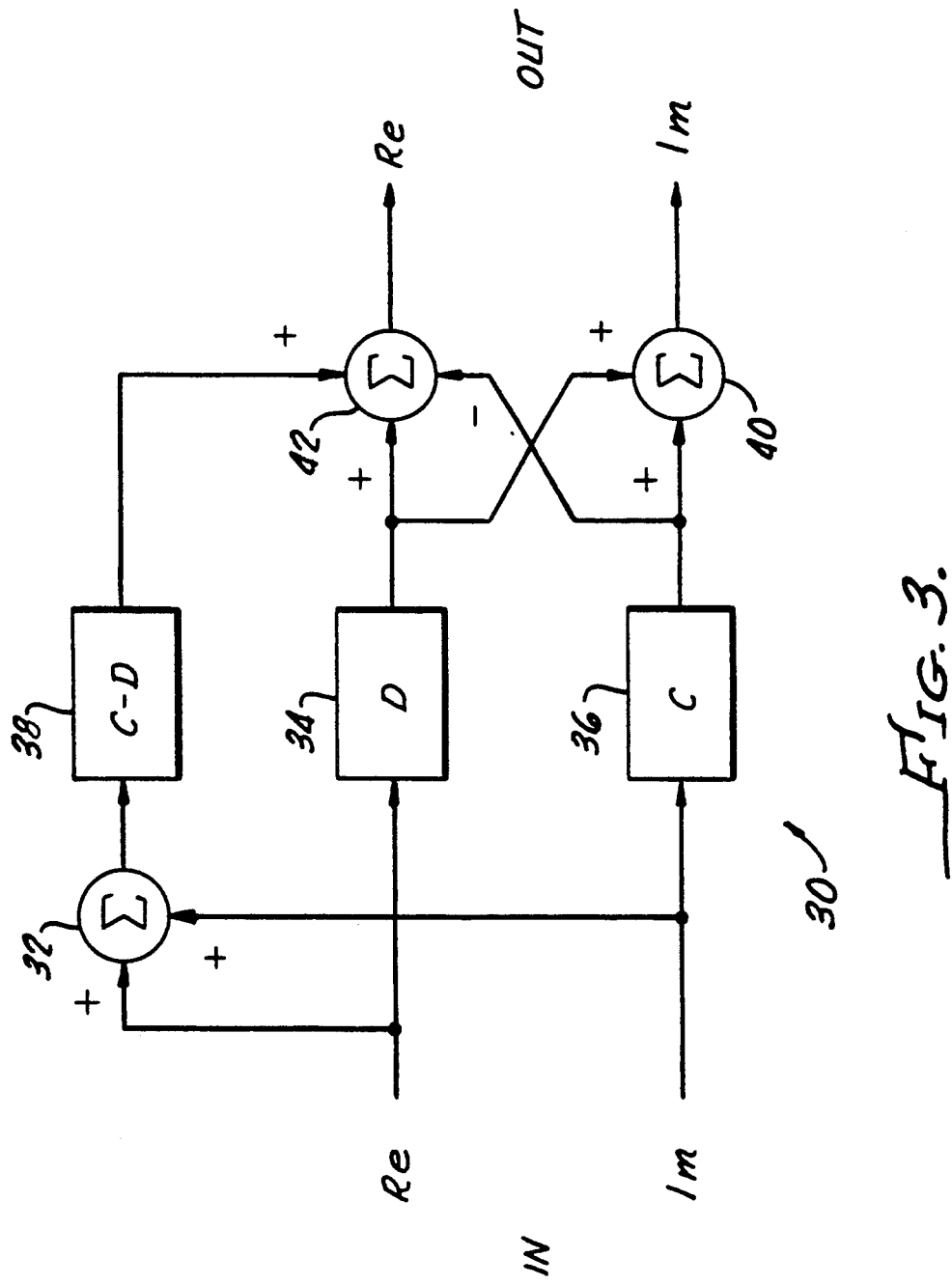
FIG. 3 illustrates application of the Speiser identity to complex multiplier structures.

In FIG. 3, real data is input to a multiplier 30 as the value of A, from equation 4, to both a summation element or adder 32 and a coefficient multiplier 34. Imaginary data is input as the value B to both the adder 32 and another coefficient multiplier 36. The coefficient multipliers 34 and 36 each multiply their respective data inputs by appropriate prestored weighting values for the coefficients D and C, respectively, and generate the products AD and BC. At the same time, the adder 32 forms the summation A+B and the result is transferred to a third multiplier 38. The third multiplier 38 multiplies the sum A+B by the prestored coefficient difference C−D. The multiplier 38 product or output provides the term (C−D)(A+B) as illustrated in equation 4 above. The products from the multipliers 34 and 36 are added together in another adder 40 to form the term AD+BC. Concurrently, the products from the multipliers 34 and 38 are added together in a third adder 42 which also receives and subtracts the product BC from the multiplier 36, to form the final term (A+B)(C−D)+AD−BC. Therefore, only three real multiplications are required, utilizing the appropriate coefficients, to achieve each complex multiplication.

In the previous 128-point example (2N=128), using the Speiser identity, the multiplier count would drop from 2582 to 1936. However, this is still an unacceptably large number for many applications. The new method of the present invention will reduce the required multiplications to less than $3(4+\log_2 M)$ per input sample, which represents over a 50 percent reduction.

The new method applied to the specific example above gives a total multiplication requirement of 1128, or <18 multiplies per valid output sample!

A summary listing of the number of multipliers required for implementing several N- and 2N-point (Pt) filtering processes depending upon the use of direct mechanization (Direct Mech.), fast convolution (Conv.), or adding the Speiser technique is illustrated in Table I.

TABLE I

| Direct Mech. N | Fast Conv. 2N-Pt | Speiser Fast Conv. 2N-Pt | Fast Conv. N-Pt | Speiser Fast Conv. N-Pt |
|---|---|---|---|---|
| 32 | 56 | 42 | 36 | 27 |
| 64 | 64 | 48 | 40 | 30 |
| 128 | 72 | 54 | 44 | 33 |

Even with the reductions on the number of multiplications through the use of multiplier free DFT structures and the Speiser identity, the number of multiplications is still significantly high for the frequency domain multiplication portion of the fast convolution filter 10. The number of multipliers typically required to implement this portion of the filter still consumes a large amount of circuitry to implement. The present invention overcomes this problem by using a new multiplication scheme and further reducing the circuitry of the FFT and IFFT to N-point processors.

Figure 4:
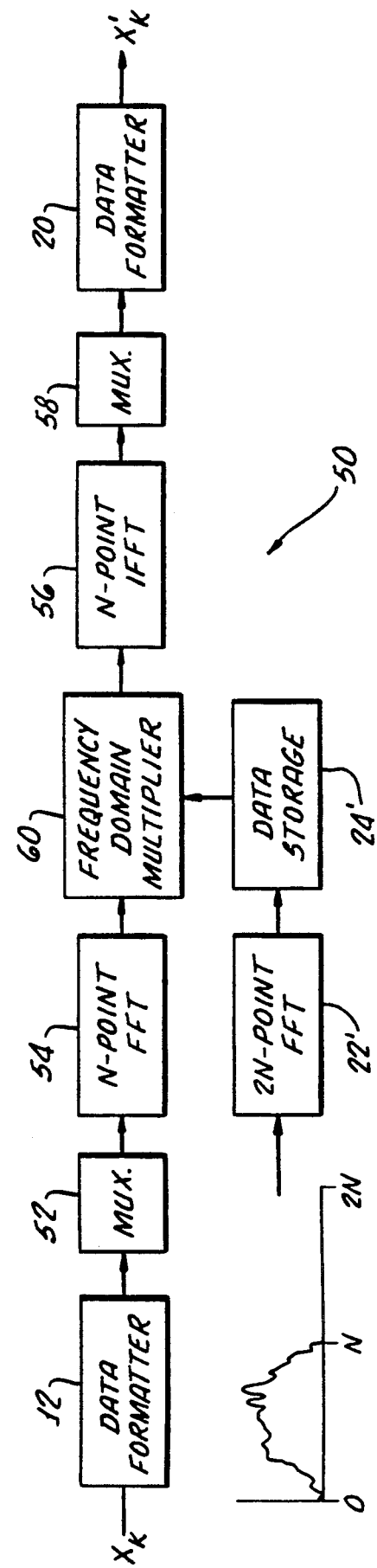
FIG. 4 illustrates an overview of a new fast convolution filter signal processing apparatus constructed and operating according to the present invention using N-point FFT and IFFT structures.

The FIR type filter of the present invention is illustrated in broad detail in FIG. 4. In FIG. 4, the new filter 50 uses data input and output formatters 12 and 20 as shown for the filter 10 above. However, the filter 50 is constructed to accommodate 2N points of real-only data. Therefore, the filter 50 uses a multiplexing element 52 to transfer every other input data point to the real input of an N-point fast Fourier transformer 54 and the other data points to the imaginary input of the transformer 54. That is, the even numbered data samples are input as real data and the odd numbered data points as imaginary data. This immediately provides an economy of scale for the filter 50 by reducing the operations that must be processed for the FFT element 44 while still accommodating 2N data points.

At the same time, the required IFFT processing element 56 will also be configured as an N-point transformer since it processes the same number of data samples as output from the FFT element 54. The N-point output data from the IFFT transformer 56 will also be transferred through a second multiplexer 58, or demultiplexer, where the data is multiplexed into a single data stream of samples from the even and odd samples output by the IFFT element 56.

Further reduction in the number of required multipliers is achieved using a new frequency multiplier stage or element 60 which reduces the number of multiplications to twelve for every two input samples or six per input sample. This is accomplished by separating the required data transformation and weighting operations in the frequency domain into five computational stages, reducing the number of multiplications required in each stage, and mechanizing the resulting operations.

Figure 5:
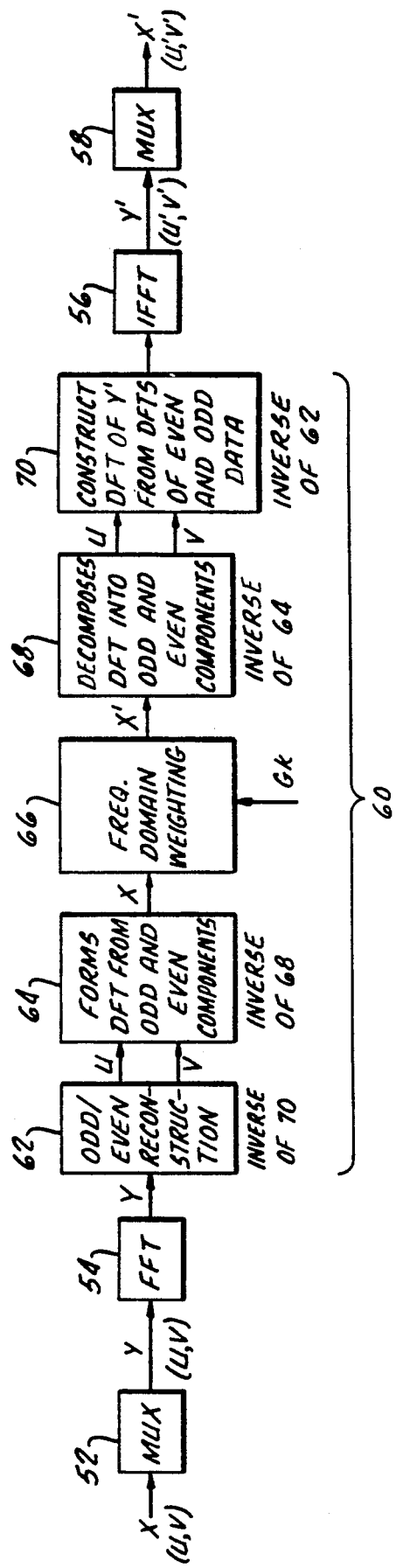
FIG. 5 illustrates an overview of the operation of the multiplier used in the apparatus of FIG. 4.
Figure 6:
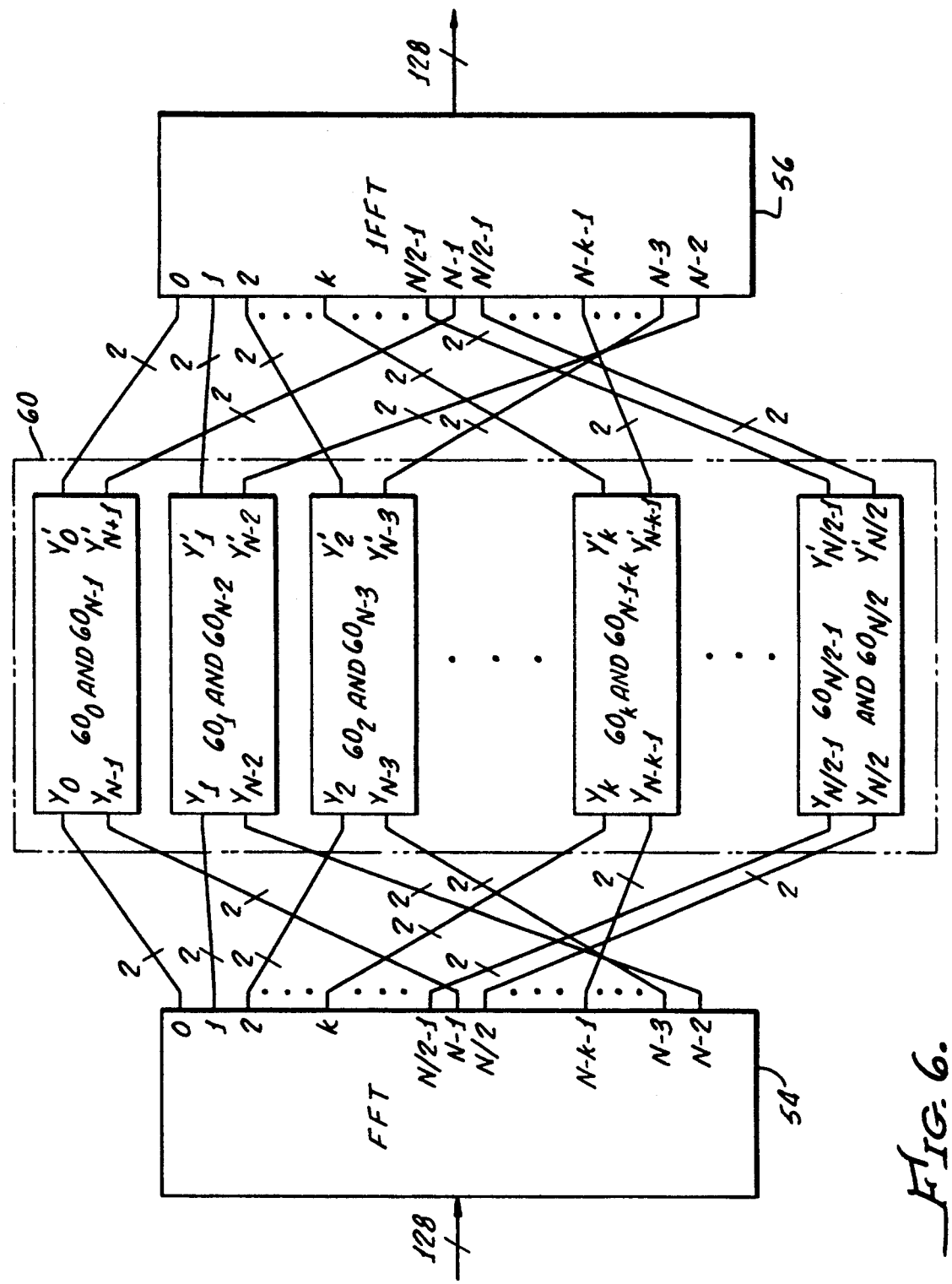
FIG. 6 illustrates the overall multiplier structure constructed from sections illustrated in further detail in FIG. 7.

The five computational stages used in the multiplication element 60 of FIGS. 4 and 6 are shown broken out as separate functional elements in FIG. 5. In FIG. 5, the multiplier 60 receives the input data x (which can be expressed as u,v) through the multiplexer 52 and which is transferred as data y (also in form u,v) to the FFT transformer 54 where it is transformed into the function $Y_k$. In a first stage or processing element 62, the transformed data $Y_k$ is divided or segregated into even and odd transformed data functions $U_k$ and $V_k$, respectively, which are transferred to a second stage or element 64. In the element 64, the data for the two functions $U_k$ and $V_k$ are weighted according to equations 5 and 6 below to produce an intermediate weighted function $X_k$, or intermediate data $X_k$. This is accomplished by multiplying the even and odd transformed data by a preselected weighting matrix. In a third processing stage 66 the function $X_k$ is weighted by the Fourier transform of the impulse response of the filter ($G_k$) to produce the transformed intermediate data function $X_k'$. The data function $X_k'$ is divided into even and odd weighted transformed functions $U_k'$ and $V_k'$ which are recombined in a processing element 70 to provide the transformed function $Y_k'$. The data represented by the transformed function $Y_k'$ is transferred to the IFFT transformer 56 where it is transformed to the time domain and subsequently de-multiplexed by the multiplexer 58.

To better understand the operation of the invention, each step is presented in more detail below. There are 2N input time samples of data resulting in 2N output frequency samples from the composite FFT consisting of FFT 54, odd/even reconstructor 62, and DFT-former 64. The weighting factors employed in the frequency domain multipliers are $W_N^{nk} = e^{-2\pi jnk/N}$; the weighting relationship (as in equation 1) is expressed as:

$$X_k = \sum_{n=0}^{2N-1} x_n W_N^{nk} \quad (5)$$

which can be separated into two processes, one for the even numbered input samples and the other for the odd numbered samples, since real-only data is being processed. The sum of these two relationships is represented by:

$$X_k = \sum_{n=0}^{N-1} x_{2n} W_{2N}^{2nk} + \sum_{n=0}^{N-1} x_{2n+1} W_{2N}^{(2n+1)k} \quad (6)$$

If new variables $u_n$ and $v_n$ are assigned to the even and odd data samples such that:

$$u_n = x_{2n}; \ v_n = x_{2n+1}; \text{ and } W_{2N}^{2nk} = W_N^{nk};$$

then equation 6 can be expressed as:

$$X_k = \sum_{n=0}^{N-1} u_n W_N^{nk} + W_{2N}^k \sum_{n=0}^{N-1} v_n W_N^{nk} \quad (7)$$

and the first N points of the DFT of the input in $$X_k = U_k + W_{2N}^k V_k \quad (8)$$

where U is the DFT of the even-numbered input samples $$U_k = \sum_{n=0}^{N-1} u_n W_N^{nk} \quad (9)$$

and V is the DFT of the odd-numbered input samples $$V_k = \sum_{n=0}^{N-1} v_n W_N^{nk} \text{ for } k = 0, 1, \ldots N - 1 \quad (10)$$

Now we can recover the last N points of the DFT of the input.
Since: $W_{2N}^{k+N} = -W_{2N}^k$, $U_{k+N} = U_k$, and $V_{k+N} = V_k$; $X_{k+N}$ can be expressed as:

$$X_{k+N} = U_{k+N} + W_{2N}^{k+1} V_{k+N} \quad (11)$$
$$= U_k - W_{2N}^k V_k \quad (12)$$

and $U_k$ and $V_k$ as:

$$U_k = \tfrac{1}{2}[X_k + X_{k+N}] \quad (13)$$

$$V_k = \tfrac{1}{2}[X_k - X_{k+N}]W_{2N}^{-k} \quad (14)$$

A new function $y_n$ can be synthesized which represents the even and odd data values of the new variables $u_n$ and $v_n$, which is expressed as:

$$y_n = u_n + j v_n \quad (15)$$

and its transformation as:

$$Y_k = U_k + j V_k \quad (16)$$

$$Y_{N-k} = U_{N-k} + j V_{N-k} \quad (17)$$

Since both $u_k$ and $v_k$ are real $$Y_{N-k} = U_k^* + j V_k^*$$

so:

$$Y_k + Y_{N-k} = 2Re[U_k] + 2jRe[V_k]$$

$$Y_k - Y_{N-k} = 2Im[U_k] + 2jIm[V_k]$$

therefore:

$$U_{kR} = \tfrac{1}{2}(Re[Y_k] + Re[Y_{N-k}]) \quad (18)$$

$$U_{kI} = \tfrac{1}{2}(Im[Y_k] - Im[Y_{N-k}]) \quad (19)$$

$$V_{kR} = \tfrac{1}{2}(Im[Y_k] + Im[Y_{N-k}]) \quad (20)$$

$$V_{kI} = \tfrac{1}{2}(Re[Y_{N-k}] - Re[Y_k]) \quad (21)$$

which can be used to divide the input transformed (FFT) data into the two transformed functions $U_k$ and $V_k$. From equations 8 and 12 we have the weighted functions:

$$X_k = U_k + W_{2N}^k V_k \quad (8)$$

$$X_{k+N} = U_k - W_{2N}^k V_k \quad (12)$$

The transformation of these functions with the filter response provides the relationships:

$$X'_k = G_k X_k \quad (22)$$

$$X'_{N+k} = G_{N-k}^* X_{N+k} \quad (23)$$

and $$U_k' = \tfrac{1}{2}[X_k' + X_{k+N}'] \quad (24)$$

$$V_k' = \tfrac{1}{2}[X_k' - X_{k+N}']W_{2N}^{-k} \quad (25)$$

To recombine the separate even and odd data paths into a the single variable function $Y_k'$ for the IFFT 56 input:

$$\begin{aligned}Y_k' &= U_k' + j V_k' \\ &= \tfrac{1}{2}\{X_k' + X_{k+N}' + (-\sin\pi k/N + j\cos\pi k/N)[X_k' - X_{k+N}']\}\end{aligned} \quad (26)$$

with:

$$y' = IFFT(Y') = u' + jv' \quad (27)$$

and $$x_{2n}' = u_n', \text{ and } x_{2n+1}' = v_n'$$

From the above equations it is clear that the multiplier 60 processes the FFT data in pairs of points. That is, the multiplier 60 is configured as a series of substantially identical processing structures each of which accommodates one pair of data points for $Y_k$ and $Y_{N-k}$. To process all of the N data points (for k from 0 to N−1), the multiplier 60 uses N such structures in which the $k^{th}$ data is paired with the $(N-k)^{th}$ data. However, some time sharing of the multipliers in each section can be used, with appropriate data storage elements connected to the output of the final stage. The use of the N multiplier structures is illustrated in the multiplier structure of FIG. 6.

In FIG. 6, the multiplier 60 is divided into a series of multiplier sections $60_k$ (for $0 \leq k \leq N-1$) which each receive one pair of complex data points, both the real and imaginary portion, as an input. The first multiplier section $60_o$ receives the values for $Y_o$ and $Y_{N-1}$, the second section $60_1$ receives the values for $Y_1$ and $Y_{n-2}$ and so forth until section $60_{N/2-1}$ is reached. In section $60_{N/2-1}$, the $(N/2-1)^{th}$ and $(N/2)^{th}$ data points are processed. In section $60_k$ the same data points are processed as in section $60_{N-1-k}$, but in a slightly different manner. It is easily seen that only 64 multiplier sections $60_k$ are used in a multiplier for accommodating 128 data points for a total number of 768 multipliers incorporated in these sections.

Figure 7A:
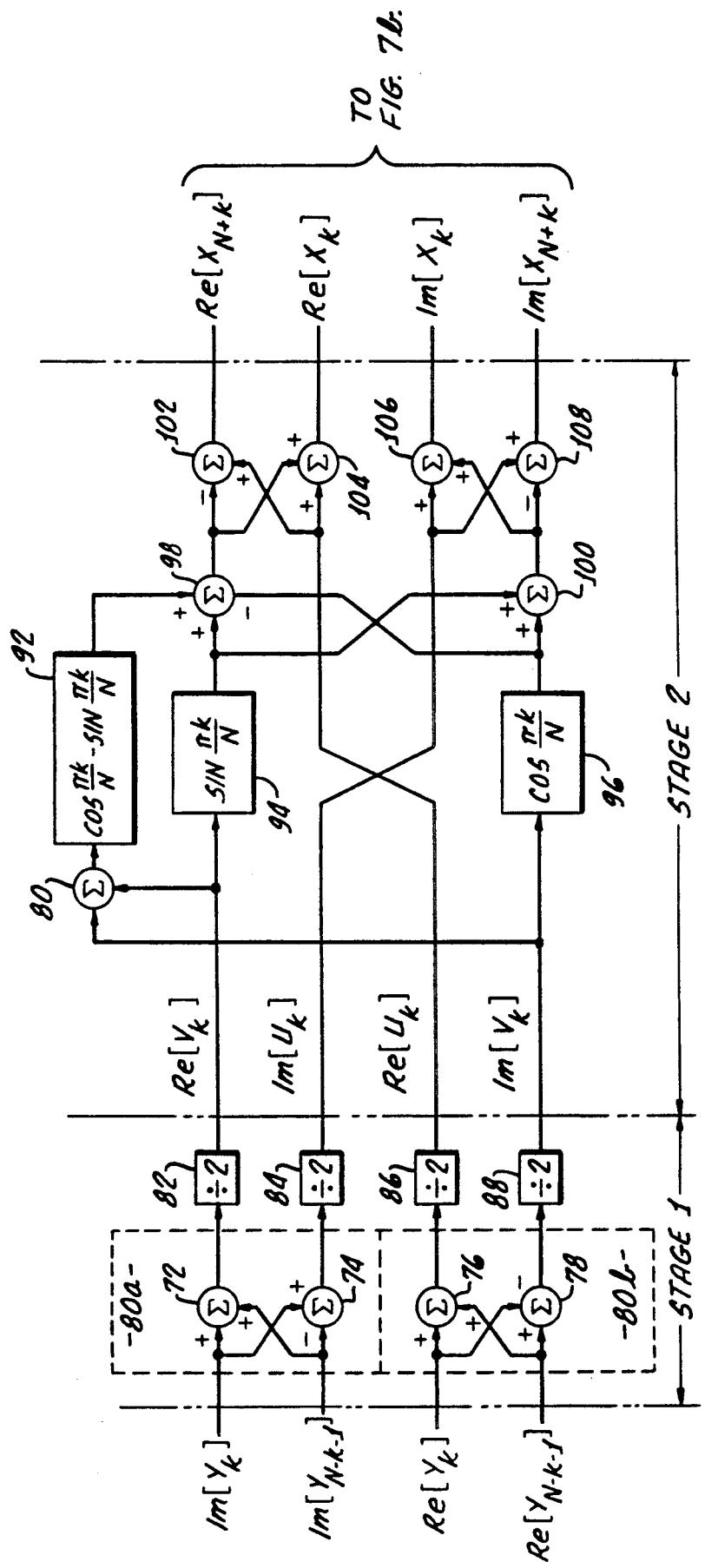
FIGS. 7a, 7b, and 7c illustrate one section of the multiplier structure constructed and operating according to the present invention for use in the apparatus of FIGS. 5 and 6.
Figure 7B:
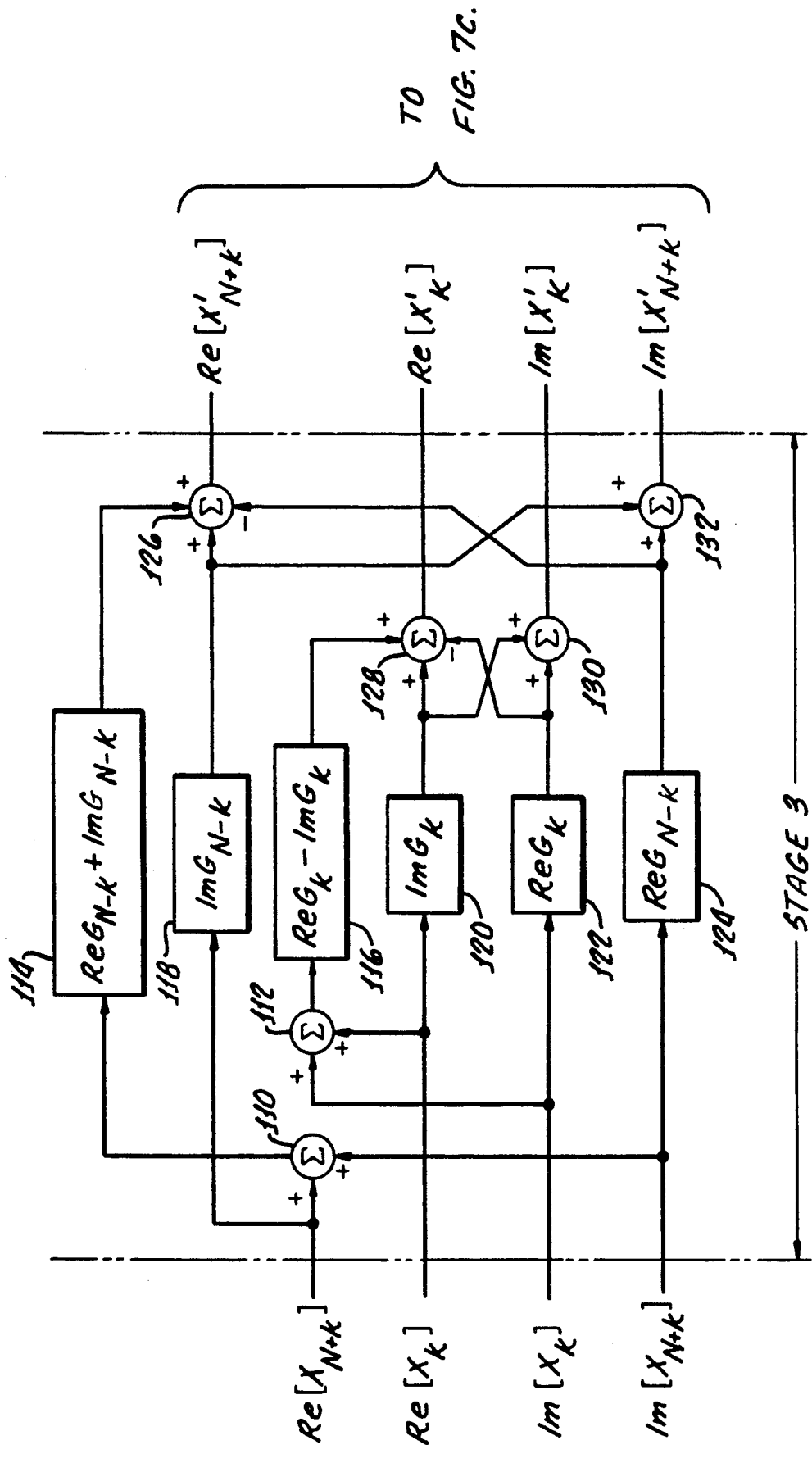
Figure 7C:
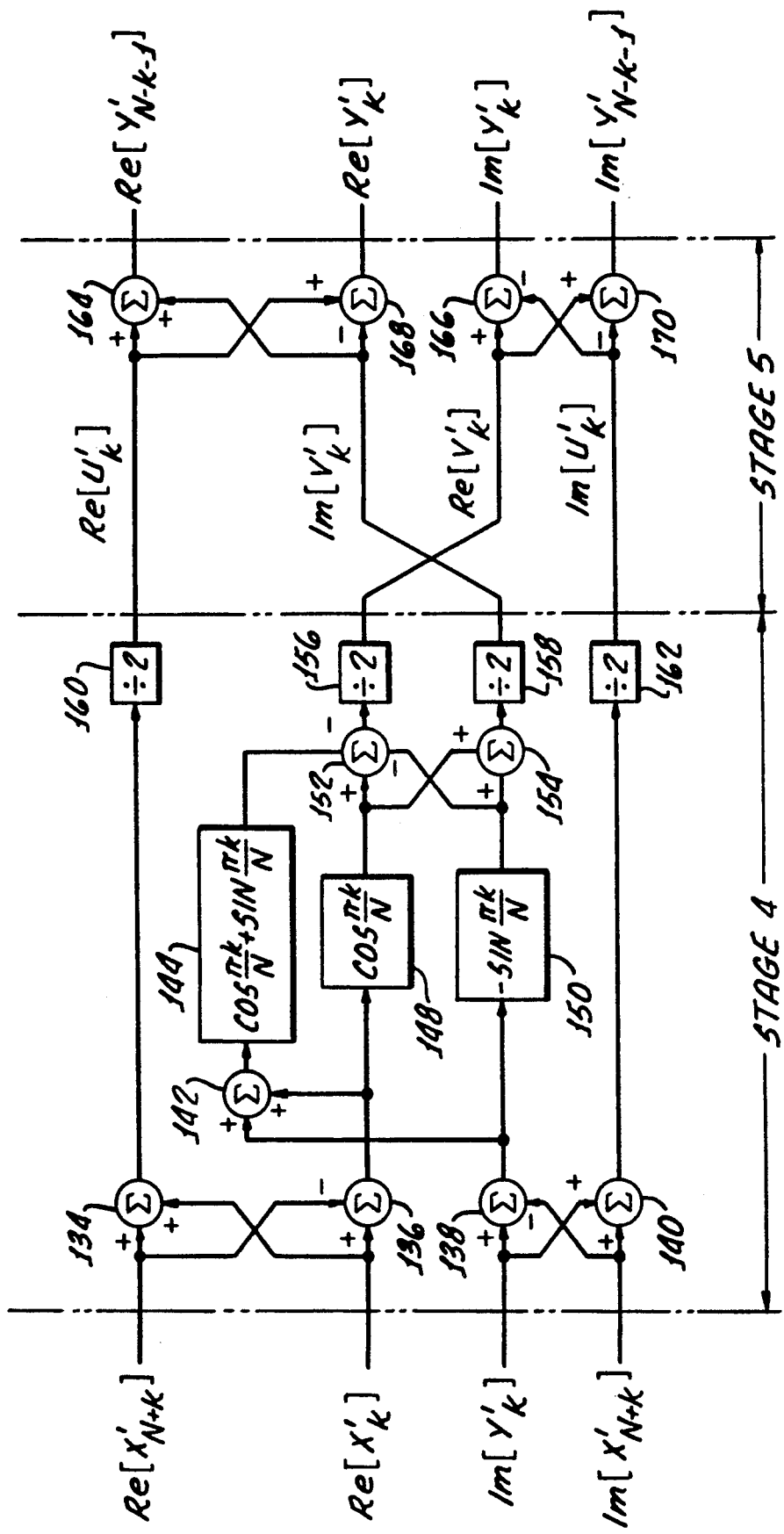

A more detailed schematic of each section of the multiplier 60 ($60_k$) constructed according to the invention is illustrated in three portions divided between FIGS. 7a, 7b, and 7c. In FIG. 7a, in a first multiplier stage, the imaginary portion of $Y_k$ is transferred to both a first summation element or adder 72 and a second adder 74. The imaginary portion for $Y_{N-k-1}$ is transferred to the first adder where it is positively summed with the imaginary portion of $Y_k$, and input to the second adder 74 where it is subtracted from the imaginary portion of $Y_k$. At the same time, the real portion of $Y_k$ is transferred as a positive input to a third summation element or adder 76 and as a negative input to a fourth adder 78. The real portion of $Y_{N-k-1}$ is transferred as a positive input to both the third and fourth adders 76 and 78, where it is summed with the real $Y_k$ value. It will be readily apparent to those skilled in the art that the adders 72, 74, 76, and 78 form a pair of 2-point butterfly processing units 80a and 80b for DFT processing.

The outputs of the adders 72, 74, 76, and 78 are connected to four dividers 82, 84, 86, and 88, respectively. These dividers are configured to divide the adder outputs by a factor of two to provide the desired real and imaginary portions of the odd and even transformer output data $Re[V_k]$, $Im[V_k]$, $Re[U_k]$, and $Im[U_k]$, respectively. These basic transformation values are then processed further to provide the multiplications necessary before the IFFT steps are performed to return these frequency domain quantities to the time domain.

Stage 1 can be shared between $60_k$ and $60_{N-1-k}$ since $U_k = U^*_{N-1-k}$ and $V_k = V^*_{N-1-k}$.

The dividends from the dividers 82 and 88, $Re[V_k]$ and $Im[V_k]$, are transferred to another adder 90, in a second multiplier stage, where they are summed to generate the $V_k$ (real and imaginary) quantity which is then multiplied times the interface weighting factor or quantity $(\cos \pi k/N - \sin \pi k/N)$ in a multiplier 92. At the same time, the divider 82 output, $Re[V_k]$, is transferred to a multiplier 94 where it is multiplied times the weighting factor $\sin \pi k/N$, and the divider 88 output, $Im[V_k]$, is transferred to a multiplier 96 where it is multiplied times the weighting factor $(\cos \pi k/N)$.

The products from the multipliers 92, 94, and 96 are transferred to a sixth summation element or adder 98 where the multiplier 96 output is subtracted from the sum of the multiplier 92 and 94 outputs to generate the quantity $(Re[V_k]\cos \pi k/N - Im[V_k]\sin \pi k/N)$. The products generated in the multipliers 94 and 96 are also transferred to an adder 100 where they are summed to generate the quantity $(Re[V_k]\sin \pi k/N + Im[V_k]\cos \pi k/N)$.

The sum generated by the adder 98 is provided as a negative input for an adder 102 and as a positive input for an adder 104 both of which also receive the quotient generated by the divider 86. The sum from adder 98 is subtracted from the divider 86 output in the adder 102 to produce the desired value for the quantity $Re[X_{N+k}]$, which is weighted intermediate data, and added to the divider 86 quotient in the adder 104 to generate the value for the quantity $Re[X_k]$, which is weighted intermediate data for the $k^{th}$ point.

The resulting output from the adder 100 is provided as a positive input to an adder 106 which also receives the quotient generated by the divider 84 and sums these two quantities to generate the quantity $Im[X_k]$. The output of the adder 100 is also provided as a negative input to an adder 108 which also receives the divider 84 quotient and sums these two quantities to generate the quantity $Im[X_{N+k}]$.

Turning now to FIG. 7b, which illustrates a third multiplier stage, an adder 110 is connected to receive and sum the outputs from the two adders 102 and 108, and an adder 112 is connected to receive and sum the outputs of adders 104 and 106. The addend from the adder 110 is then transferred to a factor multiplier 114 where it is multiplied times a filter response weighting factor $(Re[G_{N-k}] + Im[G_{N-k}])$ where $G_{N-k}$ is the Fourier transform of the filter impulse response for the $(N-k)^{th}$ data point. The addend from the adder 112 is transferred to a factor multiplier 116 where it is multiplied by the response weighting factor $(Re[G_k] - Im[G_k])$, which is the difference between the real and imaginary portions of the Fourier transformed filter impulse response for the $k^{th}$ data point.

At the same time, the addends generated by the adders 102, 104, 106, and 108 are also transferred to the filter response (weighting) multipliers 118, 120, 122, and 124, respectively, where they are multiplied times the response weighting factors $Im[G_{N-k}]$, $Im[G_k]$, and $Re[G_{N-k}]$, respectively.

The weighted products from each of the multipliers 114, 118 and 124 are transferred to a three input adder 116 where the product from the multiplier 124 is subtracted from the sum of the other two products. The adder 126 generates the quantity $Re[X'_{N+k}]$, which is transformed $(N+k)^{th}$ intermediate data. The output from each of the multipliers 116, 120 and 122 are connected to a three input adder 128 where the product from the multiplier 122 is subtracted from the products from the multipliers 116 and 120. The adder 128 generates the quantity $Re[X'_k]$, which is the real portion of the transformed intermediate data for the $k^{th}$ point. The outputs from each of the multipliers 120 and 122 are also connected to a two input adder 130 where they are summed to provide the quantity $Im[X'_k]$, which is the imaginary portion of the transformed $k^{th}$ intermediate data. The outputs from each of the multipliers 118 and 124 are connected to a two input adder 132 where they are also summed to provide the quantity $Im[X'_{N+k}]$, which is the imaginary portion of the transformed $(N+k)^{th}$ intermediate data.

Turning now to FIG. 7c, which illustrates fourth and fifth multiplier stages, the real portions of the $X'_k$ and $X'_{N+k}$ quantities are subjected to a 2-point butterfly operation by transferring the outputs of the adders 126 and 128 to two two-input adders 134 and 136. In the adder 134, these two quantities are summed and in the adder 136 the $Re[X'_{N+k}]$ quantity is subtracted from the $Re[X'_k]$ quantity. The imaginary portions of the $X'_k$ and $X'_{N+k}$ quantities are also subjected to a 2-point butterfly operation by transferring the addends from the adders 130 and 132 to two two-input adders 138 and 140. In the adder 140, these two quantities are summed and in the adder 138 the $Im[X'_{N+k}]$ quantity is subtracted from the $Im[X'_k]$ quantity.

The products from the adders 136 and 138 are summed in an adder 142, and multiplied by the weighting factor $(\cos \pi k/N + \sin \pi k/N)$ in a multiplier 144. The outputs from the adders 136 and 138 are also individually multiplied, in multipliers 148 and 150, by the weighting factors $(\cos \pi k/N)$ and $(-\sin \pi k/N)$, respectively. The weighted products from the multipliers 144 and 150 are subtracted from the product of the multiplier 148 in an adder 152, and divided by two in a divider 156. The dividend generated in the divider 156 is the real portion of the $k^{th}$ odd transformed and frequency multiplied data point, $Im[V'_k]$. The weighted products from the multipliers 148 and 150 are added together in an adder 154 and divided by two in a divider 158 to provide the imaginary portion of the $k^{th}$ odd transformed and multiplied data point, $Re[V'_k]$. The outputs of the adders 134 and 140 are each divided by two in the dividers 160 and 162, respectively, to produce the real and imaginary portions of transformed and multiplied $k^{th}$ even data points, $Re[U'_k]$ and $Im[U'_k]$.

Four final summation elements or adders form the fifth stage in each multiplier section and are configured to combine the odd and even $k^{th}$ transformed data together to provide the final frequency multiplier transformed data output, $Y'_k$, for the $k^{th}$ and $(N-k-1)^{th}$ data points input to each multiplier section. This is accomplished by adding the real portion of the even and the imaginary portion of the odd transformed data, Re[U'$_k$] and Im[V'$_k$], in an adder 164 to generate the real portion of the transformed (N−k−1)$^{th}$ data point Re[Y'$_{N-k-1}$], and adding the imaginary portions of the even and the real portion of the odd transformed k$^{th}$ data, Im[U'$_k$] and Re[V'$_k$], in an adder 166 to produce the imaginary portion of the transformed k$^{th}$ data point Im[Y'$_k$]. The imaginary portion of the odd transformed data, Im[V'$_k$], is also subtracted from the real portion of the even transformed data, Re[U'$_k$], in an adder 168 to produce the real portion of the transformed k$^{th}$ data point, Re[Y'$_k$], while the imaginary portion of the even transformed k$^{th}$ data, Im[U'$_k$], is subtracted from the real portion of the odd transformed k$^{th}$ data, Re[V'$_k$], in an adder 170, to produce the imaginary portion of the transformed (N−k−1)$^{th}$ data point Im[Y'$_{N-k-1}$].

The resulting real and imaginary portions of the transformed k$^{th}$ and (N−k−1)$^{th}$ data points represent the transformed FFT output function for these data points. These quantities are then transferred to the inverse fast Fourier transformation element 56 where it is transformed to the time domain and subsequently demultiplexed for the remainder of the filter processing.

Figure 8A:
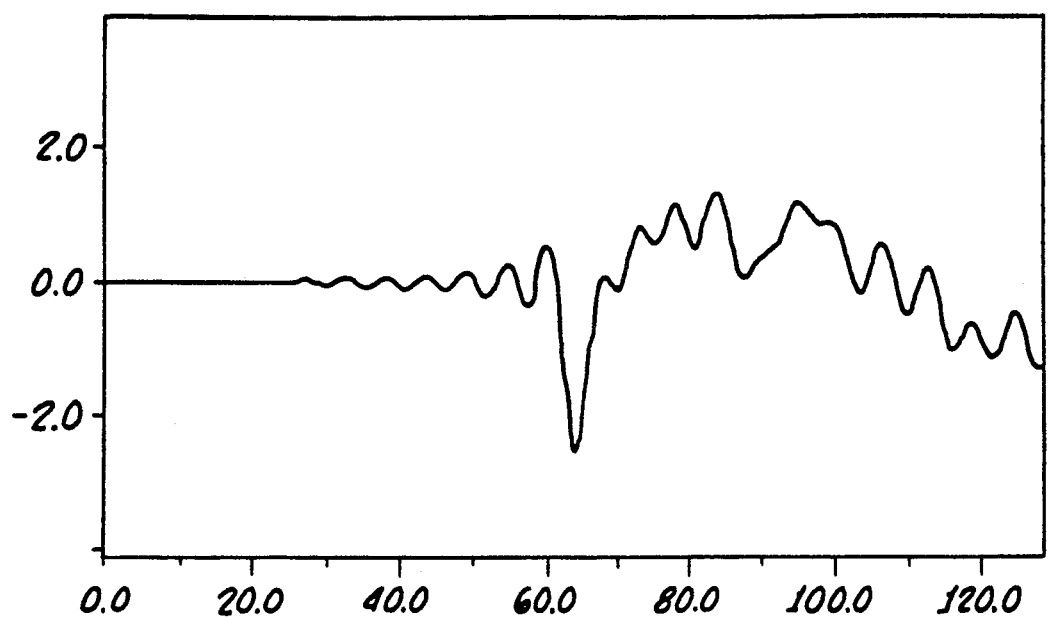
FIGS. 8a and 8b illustrate resulting filter outputs for the apparatus of FIGS. 1 and 6, respectively.
Figure 8B:
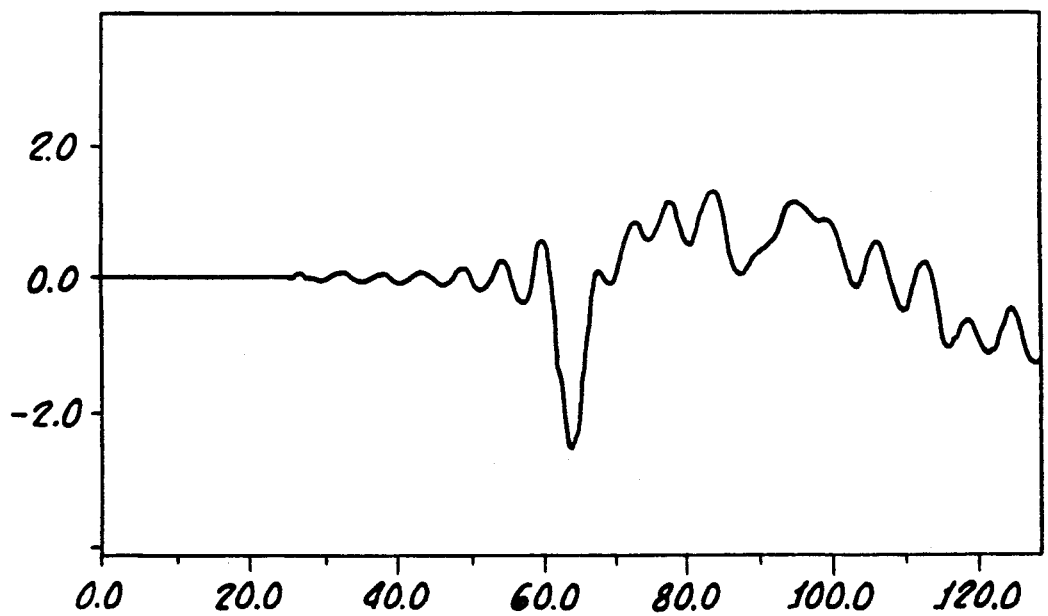

To verify the operation of the apparatus illustrated in FIG. 7, a simulation was obtained for the circuit using a conventional test set of data which is encountered in certain communications situations. This data was used as an input to a "traditional" filter device using the conventional type of multiplication circuitry as the intermediate stage shown in FIG. 1 above. The resulting output is illustrated in the graphic representation of FIG. 8a. Likewise, this data was also input to a signal processing circuit using the new inventive multiplier as an intermediate stage(s) as shown in FIG. 2 above. The results of this latter output are illustrated in the graphical representation of FIG. 8b. It is easily seen that the accuracy and integrity of the filtering process remain undegraded in any noticeable way but that there has been a great improvement in the number of elements required for realizing the filter by reducing the multiplications involved.

In preferred embodiments discussed above, the disclosed logic elements or operations are static in nature. They are configured for one weighting matrix and use fixed multiplier coefficients. However, those skilled in the art will readily recognize that the multipliers can employ dynamically adjustable coefficients where desired. This is also the case for reducing the overall apparatus, either in hardware or software, by time sharing the multipliers. In that configuration the matrix of weighting factors or coefficients would be stored in a series of one or more memory registers, ROM circuits, RAM circuits, or other storage elements familiar to those skilled in the art and provided to the multipliers as required, corresponding to the appropriate values of k and N−k−1. The periodic nature of the sin and cos based coefficients also allows a reduction in memory, since these factors can be stored and recalled using the values for k and N−k−1 as memory addresses.

However, for most applications the values for k and N−k−1 are well established in advance and can be efficiently hardwired into a multiplier (sections) array as fixed values. Each section of the multiplier is scheduled to receive particular k$^{th}$ and (N−k−1)$^{th}$ order data. Therefore, the sin and cos functions are easily computed in advance and the multipliers configured accordingly.

It will also be readily apparent to those skilled in the art that some or all of the elements discussed above, such as the summation elements, adders, and multipliers, can be implemented as dedicated hardware or software routines without deviating from the teachings of the present invention, and either type of mechanization benefits from the use of the present invention.

The foregoing description of preferred embodiments has been presented for purposes of illustration and description. It is not intended to be exhaustive nor to limit the invention to the precise forms disclosed, and many modifications and variations are possible in light of the above teaching. The embodiments were chosen and described to best explain the principles of the invention and its practical application to thereby enable others skilled in the art to best utilize the invention in various embodiments and with various modifications as are suited to the particular use contemplated. It is intended that the scope of the invention be defined by the claims and their equivalents.

What I claim as my invention is:

1. Apparatus for performing frequency domain multiplications in a fast convolution filter employing N point fast Fourier transformations on 2N points of real-only input data, comprising:
   first separation means for dividing Fourier transformed data into N/2 pairs of even and odd complex transformed data;
   first weighting means connected to said first separation means for applying a preselected weighting to said even and odd transformed data to produce intermediate transformer data;
   second weighting means connected to said first weighting means for applying a Fourier transform of an impulse response of said filter to said intermediate data to produce response weighted intermediate data;
   second separation means connected to said second weighting means for dividing said response weighted intermediate data into even and odd weighted portions; and
   combination means connected to said second separation means for combining said even and odd weighted intermediate data to provide transformed frequency domain data.

2. The apparatus of claim 1 wherein said separation means comprise first pairing means connected to receive the imaginary and real portions of the k$^{th}$ and (N−k)$^{th}$ transformed data points as input quantities for generating real and imaginary portions of the desired k$^{th}$ even and odd complex transformed data.

3. The apparatus of claim 2 wherein said apparatus is divided into N/2 multiplier sections and within each such section of said separation means comprises:
   first pairing means for dividing input complex transformed data into even and odd input data;
   first summation means connected to receive and sum the imaginary portion of k$^{th}$ and (N−k)$^{th}$ transformed data points, where $0 \leq k \leq N-1$, except for when k=0 in which case the pairing comprises the zeroth and (N/2)$^{th}$ data;
   first division means connected to receive and divide the output of said first summation means by two to generate a real portion of desired odd transformed data;
   second summation means connected to receive and subtract the imaginary portion of said transformed $(N-k)^{th}$ data point from the imaginary portion of said $k^{th}$ transformed data point;

second division means connected to receive and divide the output of said second summation means by two to generate an imaginary portion of the desired even transformed data;

third summation means connected to receive and add the real portion of the $k^{th}$ and the $(N-k)^{th}$ transformed data points;

third division means connected to receive and divide the output of said third summation means by two to generate the real portion of a desired even transformed data;

fourth summation means connected to receive and subtract the real portion of the transformed $(N-k)^{th}$ data point from the real portion of the $k_{th}$ transformed data point; and fourth division means connected to receive and divide the output of said fourth summation means by two to generate an imaginary portion of the desired odd transformed data.

4. The apparatus of claim 1 wherein said first weighting means comprises:

fifth summation means for receiving and summing real and imaginary portions of the odd transformed data;

first multiplication means for multiplying the fifth summation means output by a weighting factor $(\cos\pi k/N - \sin\pi k/N)$;

second and third multiplication means for receiving and multiplying the real and imaginary portions of the odd data times the weighting factors $\sin\pi k/N$ and $\cos\pi k/N$, respectively;

sixth summation means for receiving and adding the weighted real and imaginary portions of the odd data;

seventh summation means for receiving and summing the real portion of the weighted odd transformed data and combined weighted odd data functions and for subtracting the weighted imaginary portion of the transformed odd data therefrom;

eighth summation means for receiving and adding the addend from the sixth summation means and the imaginary portion of the transformed even data to provide an imaginary portion of a $k^{th}$ intermediate transformed data function;

ninth summation means for receiving and subtracting the addend from the sixth summation means from the imaginary portion of the transformed even data to provide an imaginary portion of $(N+k)^{th}$ transformed intermediate data;

tenth summation means connected to said seventh summation means for receiving and adding the imaginary portion of the weighted even data to the resulting addend to provide the real portion of an $k^{th}$ intermediate data function; and eleventh summation means connected to said eighth summation means for receiving and subtracting the resulting addend from the imaginary portion of the weighted even data to provide the real portion of an $(N+k)^{th}$ transformed intermediate data function.

5. The apparatus of claim 1 wherein said second weighting means comprises:

fourth and fifth multiplication means connected to receive imaginary and real portions of the $k^{th}$ intermediate data for multiplying them by the real and imaginary portions, respectively, of the Fourier transform of the complex filter response for the $k^{th}$ data point;

twelfth summation means for receiving and summing said real and imaginary portions of the $k^{th}$ intermediate data;

sixth multiplication means connected to said twelfth summation means for multiplying the twelfth addend by a difference between the real and imaginary portions of the Fourier transform of the complex filter response for the $k^{th}$ data point;

thirteenth summation means for summing the filter response weighted $k^{th}$ intermediate data and the response weighted real $k^{th}$ intermediate data, from the fourth and sixth multiplication means, and for subtracting the response weighted real $k^{th}$ intermediate data, from the fifth multiplication means, to provide the real portion of the $k^{th}$ transformed intermediate data;

fourteenth summation means connected to receive and sum said response weighted imaginary and real $k^{th}$ intermediate data to provide the imaginary portion of the $k^{th}$ transformed intermediate data;

seventh and eighth multiplication means connected to receive imaginary and real portions of the $(N+k)^{th}$ intermediate data for multiplying them by the real and imaginary portions, respectively, of the Fourier transformed complex filter response for the $(N-k)^{th}$ point;

fifteenth summation means for receiving and summing the real and imaginary portions of the $(N+k)^{th}$ intermediate data;

ninth multiplication means for generating the product of the fifteenth summation means output and the total Fourier transform of the complex filter response for the $(N-k)^{th}$ point;

sixteenth summation means for adding the ninth multiplication means product to the response weighted real portion of the $(N+k)^{th}$ data and for subtracting the response weighted imaginary portion of the $N+k^{th}$ data to provide the real portion of the $(N+k)^{th}$ transformed intermediate data; and seventeenth summation means connected to receive and sum the response weighted imaginary and real $(N+k)^{th}$ data to provide the imaginary portion of the $(N+k)^{th}$ transformed intermediate data function.

6. The apparatus of claim 5 further comprising means for detecting an impulse response of said filter for a preselected $N-1$ points of data; and Fourier transformation means connected to receive said impulse response and generate a Fourier transformation thereof.

7. The apparatus of claim 1 wherein said second separation means comprises:

eighteenth summation means for receiving and adding real portions of the $k^{th}$ and $(N+k)^{th}$ transformed intermediate data;

nineteenth summation means for receiving and subtracting the real portion of the $(N+k)^{th}$ transformed intermediate data from the real portion of the $k^{th}$ transformed intermediate data;

twentieth summation means for receiving and subtracting the imaginary portion of the $(N+k)^{th}$ transformed intermediate data from the imaginary portion of the $k^{th}$ transformed intermediate data;

twenty-first summation means for receiving and adding the imaginary portions of the $k^{th}$ and $(N+k)^{th}$ weighted transformed intermediate data;

twenty-second summation means coupled to the output of said nineteenth and twentieth summation means for receiving and adding their addends;

tenth multiplication means connected to said twenty-second summation means for multiplying the addend of the twenty-second summation means by a weighting factor $(\cos\pi k/N + \sin\pi k/N)$;

eleventh and twelfth multiplication means for receiving and multiplying the outputs from the nineteenth and twentieth summation means by the weighting factors $(\cos\pi k/N)$ and $(-\sin\pi k/N)$, respectively;

twenty-third summation means connected to receive and sum the products from the eleventh and twelfth multiplication means;

fifth division means connected to receive the output of the twenty-third summation means for dividing by two to generate the real portion of the $k^{th}$ odd transformed and frequency multiplied data point;

twenty-fourth summation means connected to receive and subtract the products of the tenth and twelfth multiplication means from the product of the eleventh multiplication means;

sixth division means connected to receive the output of the twenty-fourth summation means for dividing by two to generate the imaginary portion of the $k^{th}$ odd transformed and frequency multiplied data point; and seventh and eighth division means connected to receive the outputs of the eighteenth and twenty-firth summation means for dividing by two to generate the real and imaginary portions of the $k^{th}$ even transformed and frequency multiplied data point, respectively.

8. The apparatus of claim 7 wherein said combination means comprises:

twenty-fifth summation means connected to receive and sum the real portions of the $k^{th}$ even and odd transformed and frequency multiplied data points;

twenty-sixth summation means connected to receive and subtract the real portion of the $k^{th}$ even from the real portion of the $k^{th}$ odd, transformed and frequency multiplied data points;

twenty-seventh summation means connected to receive and sum the imaginary portions of the $k^{th}$ even and odd transformed and frequency multiplied data points; and twenty-eighth summation means connected to receive and subtract the imaginary portion of the $k^{th}$ even from the imaginary portion of the $k^{th}$ odd, transformed and frequency multiplied data points.

9. The apparatus of claim 1 further comprising factor means connected to said first and second weighting means for computing and dynamically adjusting values for said weighting factors according to predetermined multiplier configurations.

10. A method for performing frequency domain multiplications in a signal filter employing fast Fourier transformations of the N-point type for 2N points of real-only input data, comprising the steps of:

dividing Fourier transformed data into N/2 pairs of even and odd complex transformed data;

applying a preselected weighting to said even and odd transformed data to produce intermediate weighted data;

applying a Fourier transform of an impulse response of the filter to the intermediate weighted data to produce weighted intermediate data;

dividing said weighted intermediate data into even and odd weighted portions; and combining said even and odd weighted intermediate data to provide transformed frequency domain data.

11. The method of claim 10 wherein said first step of dividing the transformed data, comprises the steps of receiving imaginary and real portions of the $k^{th}$ and $(N-k)^{th}$ transformed data points as input quantities, except for when $k=0$ where the zeroth and $(N/2)^{th}$ data is paired, and generating real and imaginary portions of the desired $k^{th}$ even and odd complex transformed data.

12. The method of claim 11 wherein said frequency domain multiplications are sub-divided into N/2 multiplier operations, each comprising the steps of:

summing the imaginary portion of the $k^{th}$ and $(N-k)^{th}$ data points, where $0 \leq k \leq N-1$, and dividing by two to generate a real portion of desired odd transformed data;

subtracting the imaginary portion of the $(N-k)^{th}$ transformed data point from the imaginary portion of the $k^{th}$ transformed data point and dividing by two to provide an imaginary portion of the desired even transformed data;

summing the real portion of the $k^{th}$ and the $(N-k)^{th}$ transformed data points and dividing by two to provide the real portion of a desired even transformed data; and subtracting the real portion of the $(N-k)^{th}$ transformed data point from the real portion of the $k_{th}$ transformed data point and dividing by two to provide a real portion of the desired odd transformed data.

13. The method of claim 10 wherein said step of applying a preselected weighting to the transformed data, comprises the steps of:

adding the real and imaginary portions of the odd transformed data together and multiplying by a weighting factor $(\cos\pi k/N - \sin\pi k/N)$;

multiplying the real and imaginary portions of the odd data times the factors $\sin\pi k/N$ and $\cos\pi k/N$, respectively;

summing the results the weighted real and imaginary portions of the odd data with the imaginary portion of the transformed even data function to provide an imaginary portion of a $k^{th}$ intermediate transformed data function;

subtracting the sum of the weighted real and imaginary portions of the odd transformed data from the imaginary portion of the transformed even data to provide an imaginary portion of $(N+k)^{th}$ transformed intermediate data;

summing the real portion of the weighted odd transformed data and combined odd data functions and subtracting the weighted imaginary portion of the transformed odd data therefrom, and adding the resulting addend to the real portion of the weighted even data to generate the real portion of an $k^{th}$ intermediate data function; and subtracting the resulting addend from the real portion of the weighted even data to provide the real portion of an $(N+k)^{th}$ transformed intermediate data function.

14. The method of claim 10 wherein said step of applying a Fourier transform of the impulse response of the filter, comprises the steps of:

multiplying said imaginary and real portions of the $k^{th}$ intermediate data by the real and imaginary portions, respectively, of the transformed complex filter response for the $k^{th}$ data point;

summing said real and imaginary portions of the $k^{th}$ intermediate data and multiplying by the total complex filter response for the $k^{th}$ data point;

summing the $k^{th}$ filter weighted intermediate data and the real portion of the impulse weighted $k^{th}$ intermediate data and subtracting the imaginary portion of the response weighted $k^{th}$ intermediate data to provide the real portion of a $k^{th}$ transformed intermediate data function;

summing the imaginary and real portions of the $k^{th}$ intermediate data to provide the imaginary portion of the $k^{th}$ transformed intermediate data function;

multiplying the imaginary and real portions of the $(N+k)^{th}$ intermediate data by the real and imaginary portions, respectively, of the transformed complex filter response for the $(N+k)^{th}$ point;

summing the real and imaginary portions of the $(N+k)^{th}$ intermediate data, and multiplying times the total transformed filter response for the $(N+k)^{th}$ point;

summing the impulse weighted $(N+k)^{th}$ intermediate data to the weighted real $(N+k)^{th}$ data and subtracting the imaginary weighted $k^{th}$ data to provide the real portion of the $(N+k)^{th}$ transformed intermediate data;

summing the impulse weighted imaginary and real $(N+k)^{th}$ data to provide the imaginary portion of the $(N+k)^{th}$ transformed intermediate data function.

15. The method of claim 14 further comprising the steps of detecting an impulse response of said filter for a preselected $N-1$ points of data, and generating a Fourier transformation thereof.

16. The method of claim 10 wherein said step of dividing said transformed weighted intermediate data into even and odd weighted portions, comprises the steps of:

summing the real portions of said $k^{th}$ and $(N+k)^{th}$ transformed intermediate data and dividing by two to generate the real portions of the $k^{th}$ even transformed and frequency multiplied data;

summing the imaginary portions of said $k^{th}$ and $(N+k)^{th}$ transformed intermediate data and dividing by two to generate the imaginary portion of the $k^{th}$ even transformed and frequency multiplied data point;

subtracting the real portion of said $(N+k)^{th}$ transformed intermediate data from the real portion of said $k^{th}$ transformed intermediate data to provide a first intermediate addend;

subtracting the imaginary portion of the $(N+k)^{th}$ transformed intermediate data from the imaginary portion of said $k^{th}$ transformed intermediate data to provide a second intermediate addend;

multiplying said first and second intermediate addends by weighting factors of $\cos\pi k/N$ and $-\sin\pi k/N$, respectively;

summing said first and second intermediate addends and multiplying by a weighting factor of $(\cos\pi k/N + \sin\pi k/N)$ to provide a weighted third intermediate addend;

adding the weighted first and second intermediate addends and dividing by two to provide the real portion of the $k^{th}$ odd frequency domain multiplied data point; and subtracting said weighted second and third intermediate addends from said weighted first intermediate addend and dividing by two to provide the imaginary portion of the $k^{th}$ odd frequency domain multiplied data point.

17. The method of claim 10 wherein said step of combining said even and odd transformed frequency domain data, comprises the steps of:

summing the real portions of the $k^{th}$ even and odd transformed and multiplied data to provide the real portion of the $(N-k)^{th}$ transformed frequency domain data;

subtracting the real portion of the $k^{th}$ even from the real portion of the $k^{th}$ odd, transformed and frequency multiplied data points to provide the real portion of the $k^{th}$ transformed frequency domain data;

summing the imaginary portions of the $k^{th}$ even and odd transformed and frequency multiplied data to provide the imaginary portion of the $k^{th}$ transformed frequency domain data; and subtracting the imaginary portion of the $k^{th}$ even from the imaginary portion of the $k^{th}$ odd, transformed and frequency multiplied data to provide the imaginary portion of the $(N-k)^{th}$ transformed frequency domain data.

18. The method of claim 10 further comprising the steps of computing and dynamically adjusting values for said weighting factors according to predetermined multiplier configurations.

19. The method of claim 10 further comprising the steps of inputting said even and odd transformed data values as real and imaginary data.

* * * * *